United States Patent
Chandler (10) Patent No.: US 6,859,097 B2
(45) Date of Patent: Feb. 22, 2005

(54) RADIO FREQUENCY FEEDBACK AMPLIFIER CIRCUITS

(76) Inventor: Stephen Anthony Gerard Chandler, Rodborough Radio Technology, Suite 15 Bath Road Trade Estate, Lightpill, Stroud GL5 3QF (GB)

( * ) Notice: Subject to any disclaimer, the term of this patent is extended or adjusted under 35 U.S.C. 154(b) by 0 days.

(21) Appl. No.: 10/276,555

(22) PCT Filed: May 14, 2001

(86) PCT No.: PCT/GB01/02081

§ 371 (c)(1),
(2), (4) Date: Nov. 18, 2002

(87) PCT Pub. No.: WO01/89081

PCT Pub. Date: Nov. 22, 2001

(65) Prior Publication Data

US 2004/0100330 A1 May 27, 2004

(30) Foreign Application Priority Data

| May 16, 2000 | (GB) | ............................................. 0011664 |
| Jul. 22, 2000 | (GB) | ............................................. 0017927 |
| Aug. 25, 2000 | (GB) | ............................................. 0020858 |
| Nov. 21, 2000 | (GB) | ............................................. 0028315 |
| Feb. 15, 2001 | (GB) | ............................................. 0103691 |

(51) Int. Cl.[7] ........................... H03F 1/34; H03F 3/191
(52) U.S. Cl. ..................................... 330/107; 330/305
(58) Field of Search ................................ 330/107, 109, 330/294, 302, 305, 306

(56) References Cited

U.S. PATENT DOCUMENTS

| 3,617,915 A | | 11/1971 | Amemiya et al. .......... 330/292 |
| 3,806,828 A | * | 4/1974 | Johnson ........................ 331/58 |
| 4,409,557 A | | 10/1983 | Sechi .......................... 330/277 |
| 5,237,288 A | | 8/1993 | Cleveland ................... 330/107 |
| 5,469,114 A | | 11/1995 | Saxena ........................ 330/107 |
| 5,550,520 A | | 8/1996 | Kobayashi ................... 333/213 |
| 6,313,706 B1 | * | 11/2001 | Kakuta et al. .............. 330/302 |
| 6,636,112 B1 | * | 10/2003 | McCune ................. 330/297 X |

FOREIGN PATENT DOCUMENTS

| EP | 0 831 584 | 3/1998 |
| JP | 59 182 609 | 10/1984 |
| JP | 63 312 705 | 12/1988 |
| JP | 6 232 660 | 8/1994 |

* cited by examiner

Primary Examiner—Steven J. Mottola
(74) Attorney, Agent, or Firm—Young & Thompson (57) ABSTRACT

A radio frequency feedback amplifier circuit of high linearity within the range of frequencies with which the circuit is to be used includes a high gain amplifier incorporating a bandpass filter in the form of a single resonator which may be tunable, connected in the forward path of the amplifier stage and tuned so that its resonant frequency is at substantially the signal frequency, and a linear passive feedback circuit. A tuning arrangement (64, 65, 66, 67) includes phase detection elements (66), such as a Gilbert cell, for determining the phase shift across the resonator (62) and for adjusting a variable capacitance (64, 65) within the resonator (62) to tune the resonant circuit, in dependence on the frequency of the input to the circuit. Such an amplifier circuit may be used to achieve high linearity and stability at reasonable manufacturing cost, with much greater simplicity than can be achieved using other feedback techniques.

28 Claims, 9 Drawing Sheets

RADIO FREQUENCY FEEDBACK AMPLIFIER CIRCUITS

This invention relates to radio frequency feedback amplifier circuits.

Generally the linearity of radio frequency power amplifiers is important in preventing spectral spreading, particularly of spectrally efficient forms of digital modulation which do not use constant envelope techniques. It is also important where a single amplifier is used to amplify more than one signal, even if this is of constant envelope. Not only is the linearity of the transfer characteristic important, but, if more than one transmission is to be made from separate transmitters using antennae that are close to one another, mutual intermodulation products can be generated by the signal from one antenna being picked up by the other antenna and modulated by the time varying output impedance of the transmitter driving that antenna.

As is well known, Class A amplification can achieve good linearity at the cost of low power efficiency, and the use of devices having inherently good linearity, such as HBT's, can be beneficial. However, in many cases, the required performance necessitates use of special linearisation techniques with such devices, such as pre-distortion techniques, feedback techniques and feed forward techniques. In the case of pre-distortion techniques, the implementation can be complex, and therefore costly, because of the need to monitor the transmission over a large bandwidth in order to adjust the pre-distortion. Also these techniques can only be used to compensate for transfer characteristic non-linearity, and do not reduce mutual intermodulation effects. Feed forward techniques can be used effectively, although they require accurate adjustment making them expensive to produce, and also do not reduce mutual intermodulation effects.

Feedback is capable of reducing the effects of both types of non linearity by a factor equal to the loop gain. However the usual feedback techniques can also involve a high level of complexity in their implementation and can suffer from the effects of non linearity in frequency changing components.

It is an object of the invention to provide a radio frequency feedback amplifier circuit of high linearity.

According to the present invention there is provided a radio frequency feedback amplifier circuit of high linearity within, and close to, the range of frequencies with which the circuit is to be used, the circuit comprising high gain amplifier means incorporating a bandpass filter in the form of a resonance means connected in the forward path of the amplifier means and having its resonant frequency at substantially the signal frequency, and feedback means in the form of a linear passive circuit.

Such an amplifier circuit may be used to achieve high linearity and stability at reasonable manufacturing cost, with much greater simplicity than can be achieved using other feedback techniques. The linear passive circuit may be simply a conductive link providing substantially no attenuation, or may be an attenuator comprising resistance and/or capacitance elements.

As used in this specification the terms "resonance means" and "resonator" include any bandpass filter arrangement having a dominant conjugate pole pair or a set of closely spaced alternating high Q pole and zero pairs such that the number of pole pairs exceeds the number of zero pairs by one and such that the phase never varies by more than ±90 degrees from its mid point value. Such functions may be produced by the impedance or admittance of passive one port networks.

It should be noted that the technique of bandpass feedback is qualitatively different to simple rf feedback such as is commonly used for impedance matching and gain stabilisation in MMIC's. This requires instantaneous waveform following involving a wide range of spectral components. Such techniques as class B amplification cannot be used as they are likely to result in waveform distortion due to such effects as slew rate limiting and saturation, which cannot be ameliorated by feedback. By contrast bandpass feedback, like Cartesian feedback, is only concerned with the instantaneous complex envelope of the signal. This removes the limitation of using class A amplification.

The resonance means preferably has a single resonance and is of a type for which the maximum variation of phase shift with frequency is 180°. A resonator with a single resonance is the simplest and most obviously useful filter. However it may have a number of resonant frequencies provided that its response is substantially proportional to the impedance or admittance of a passive one port network.

One possible application of such a radio frequency amplifier circuit is in a distributed circuit switched telecommunication network of a type, such as is disclosed in International Published Patent Application No. WO 97/13333, which does not require a central exchange or interconnecting infrastructure but in which a plurality of transmitting and receiving stations are provided at randomly distributed locations, switching circuitry being provided within the stations themselves for routing of calls between stations in the network utilising other stations in the network for relaying of such calls where necessary. In this case the transmitters of the stations within the network may incorporate linear amplifiers to effect linear modulation of the carrier frequency in order to provide optimum bandwidth efficiency.

However the amplifier circuit of the invention may also be used in many other applications in which high linearity amplification is required at radio frequencies.

In order that the invention may be more fully understood, preferred embodiments in accordance with the invention will now be described, by way of example, with reference to the accompanying drawings in which.

Figure 1:
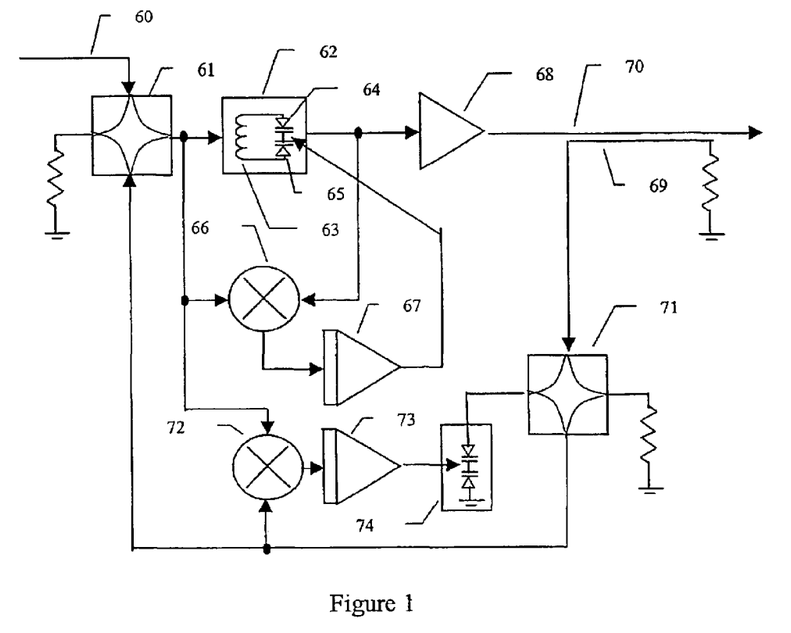
FIG. 1 is a block diagram of a first embodiment.

FIG. 1 is a block diagram of a radio frequency (rf) feedback power amplifier circuit in accordance with the invention which may be used to achieve high linearity and stability at reasonable manufacturing cost, with much greater simplicity than can be achieved using other feedback techniques. In FIG. 1 the input signal to the circuit is supplied by way of an input 60 to a hybrid signal combiner 61 used as a comparator, and a resultant signal is then lightly coupled from the combiner 61 to a coaxial resonator 62 incorporating an inductor 63 and capable of being tuned by two varactor diodes 64 and 65. A Gilbert cell phase detector 66 is provided to determine the phase difference across the resonator 62, and the output from the phase detector 66 is fed to an integrator 67 which supplies a control signal to the common point of the varactor diodes 64, 65 in order to adjust the resonant frequency to provide a 90° phase shift between the inputs of the Gilbert cell at the transmission frequency. The phase shifts in the circuit are designed to coincide with maximisation of the loop gain. It should be noted that this is not very critical as an error of 45° will only result in a reduction of 3 dB in the loop gain.

The output of the resonator 62 is fed to the rf amplifier stage 68 which in turn supplies its output to the transmit aerial. A directional coupler 69 is provided so as to supply a feedback signal to the comparator 61 by way of an arrangement for adjusting the phase of the loop gain by 180° at the resonant frequency of the resonator 62. This is implemented using a hybrid signal splitter 71 and a varactor 74. A further Gilbert cell phase detector 72 and integrator 73 may be used to automatically control the centre frequency loop phase shift by means of the varactor 74.

The integrators 67, 73 referred to in the above description may be replaced by EEPOTs, that is digitally controlled potentiometers, which have the advantage of memorising adjustment values between periods of transmission. In each case the EEPOTs may be clocked by the 100 Hz transmit control signal, the up/down line being controlled by a comparator on the output of the corresponding Gilbert cell phase detector. However the response obtainable with an integrator may be sufficient in many circumstances so that the additional complication of such EEPOTs is unlikely to be necessary.

Such a circuit provides high linearity using bandpass feedback, but without demodulation or frequency changing as would be required for cartesian feedback. Since the performance of feedback loops at radio frequency is determined by the group delay round the loop, the removal of delay associated with the components used in frequency changing etc., particularly any filtering, ensures that the methods described herein can achieve higher bandwidth and loop gain than are achievable using other more complex methods. A high Q resonator is provided in the forward path of the high loop gain feedback amplifier which would otherwise be broadband. Closed loop stability is achieved so long as other phase shifts around the loop contribute less than 90° within the frequency range over which loop gain exceeds unity. If the circuit is adjusted so that the extra phase shift is zero at the centre of the frequency band, all that is required is that the phase shift of the circuit apart from the resonator should vary by less than 90° over a frequency range of the required loop gain multiplied by the bandwidth over which the loop gain exceeds this value.

For example, if the extra phase shifts vary by less than 90° over say 50 MHz, then a loop gain exceeding 20 dB is achievable over a bandwidth of 5 MHz or a loop gain of 40 dB over 500 kHz, etc. There is thus a linearity improvement (or loop gain) bandwidth product of 50 MHz. This may also be specified as the average group delay of the open loop, apart from the resonator, over the closed loop bandwidth which is ¼*50 MHz=5 ns. This highlights the pivotal importance of keeping the group delay round the loop low.

Figure 4:
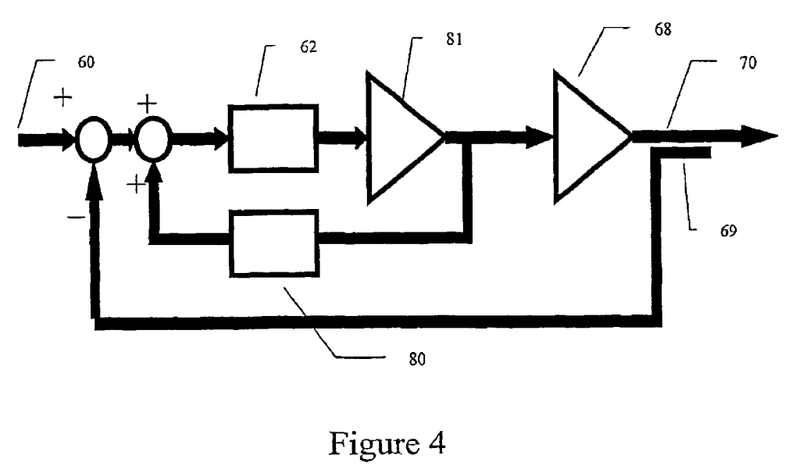

The Q of resonators which may be implemented in monolithic integrated circuits is rather low, a figure of 10 being fairly typical. Thus, where the arrangement is to be incorporated into an integrated circuit, as well as for signals having a very narrow bandwidth, it may be desirable to include means for increasing the effective Q of the resonator. Fortunately this may be achieved by the use of positive feedback using any of the circuit topologies used for r.f. oscillators. FIG. 4 shows a generic block diagram indicating the use of positive feedback by way of an attenuation 80 from the output of an amplifier stage 81 preceding the amplifier 68 to be linearised and following the resonator 62. The use of such positive feedback has the effect of increasing the gain as well as enhancing the Q. It might be thought that this technique could result in instability or oscillation which would obviously cause malfunction. However, even if the feedback around the resonator 62 causes oscillation on open loop, the overall feedback loop from the directional coupler 69 will stabilise the system and prevent oscillation occurring. In fact there is little difference in the stability margin between systems with resonators which are just stable and systems with resonators which are just unstable. In fact optimum performance is obtained when the resonator is on the border between stability and instability.

Figure 2:
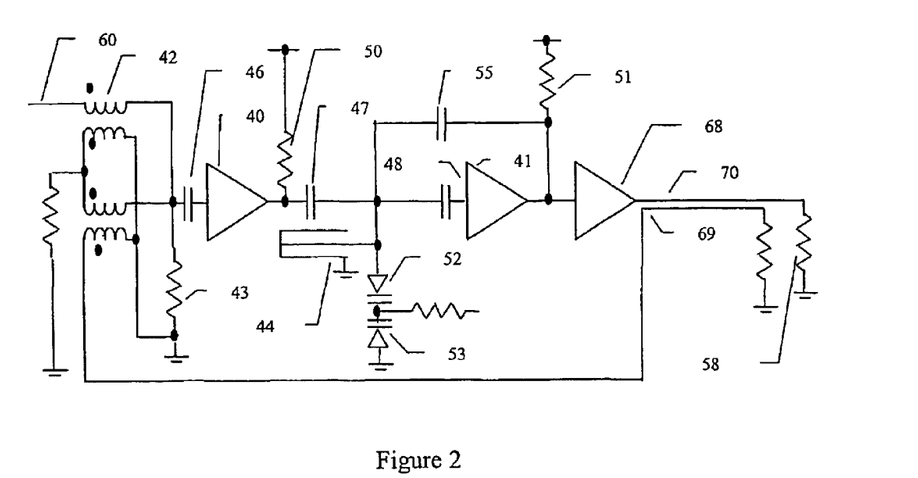
FIGS. 2 and 4 are a circuit diagram and a block diagram of a second embodiment.

FIG. 2 shows a small rf feedback power amplifier circuit in accordance with the invention which uses positive feedback to enhance the Q of the resonator. The topology used is basically that of a Butler oscillator, and comprises, in addition to the rf amplifier stage 68, monolithic amplifier stages 40 and 41 (the latter corresponding to the amplifier stage 81 in FIG. 4), a balun 42 (comprising four windings on a single figure-of-eight-shaped ferrite core), a coaxial resonator 44, capacitors 46, 47 and 48 and resistors 43, 49, 50 and 51. Two varactor diodes 52 and 53 and the resistor 54 are provided to adjust the resonant frequency in a manner similar to that described with reference to FIG. 1, and a variable capacitor 55 serves as the attenuator (80 in FIG. 4) for adjustment of the positive feedback. The signal from the output 70 of the circuit is supplied to the load 58. Such a circuit arrangement has been used very successfully to linearise a 10 Watt 425 MHz power amplifier.

Although the topology of the above described circuit arrangement based on that of a Butler oscillator does have certain advantages, there is no reason why other oscillator topologies might not also be used in such an application, such as those of the Colpitts and Hartley oscillators. Of course, in these arrangements, although an oscillator circuit arrangement is used, it will be appreciated that the circuit is prevented from oscillating by virtue of the overall feedback loop from the directional coupler 69 to the input.

Figure 3:
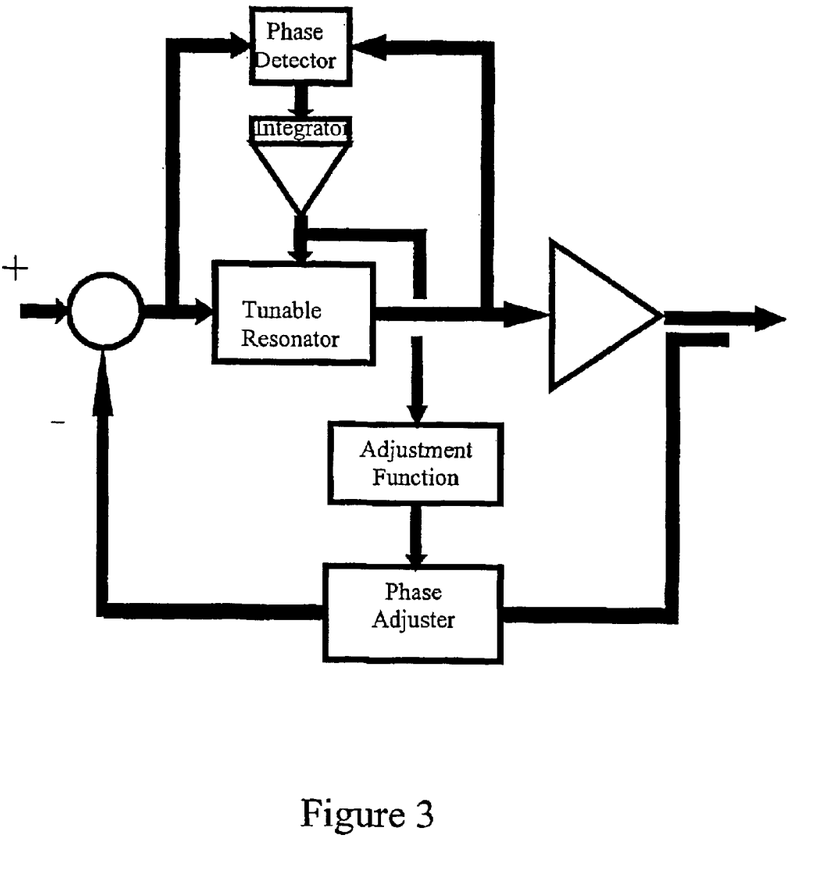
FIG. 3 is a block diagram of a third embodiment.

Should the simultaneous use of two adjustment loops, one adjusting centre frequency and the other the phase at the signal frequency as in FIG. 1, not function reliably an alternative method involving open loop phase adjustment can be used as shown in FIG. 3. The adjustment function in FIG. 3 would normally be a memoryless linear or non-linear function. This circuit makes it easier to unconditionally guarantee stability and the avoidance of false convergence of the adjustment loops and will probably provide adequate accuracy for all practical applications. It should be noted that in this method the phase adjustment is designed to track the centre frequency of the resonator, not the operating frequency, even though under intended operation the former should track the latter. Direct tracking of the frequency as shown in FIG. 1 could potentially result in false convergence and oscillation. Although FIG. 3 shows analogue implementation of the loops, in fact digital implementation of the integrator and adjustment function is preferred for more demanding specifications because of the ease of implementation and calibration.

Figure 5:
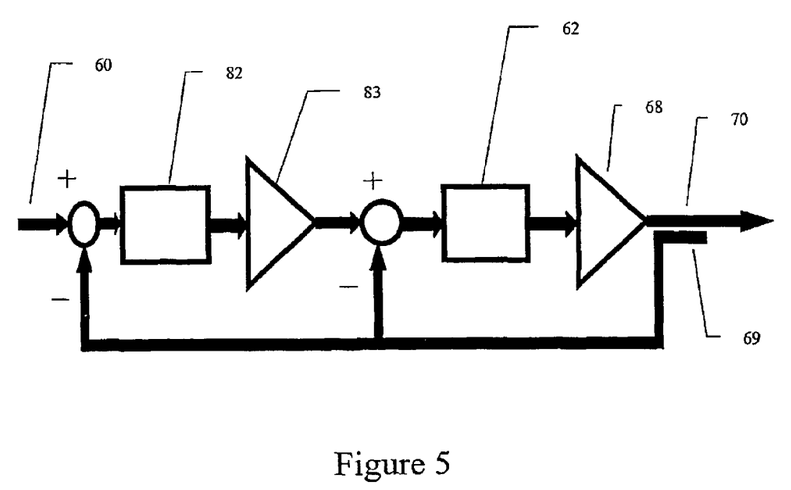
FIG. 5 is a block diagram of a fourth embodiment.

Should the linearity requirements exceed those which can be met by a single loop as in FIG. 1, further improvement can be achieved by nesting loops, i.e. using a feedback amplifier as the amplifier to be linearised, as shown in FIG. 5. In this case the amplifier, constituted by the amplifier stage 68 provided with the resonator 62 and feedback loop to increase linearity, is further linearised by being preceded by an amplifier stage 83 to increase the gain provided with a resonator 82 and further feedback loop. However, if the original amplifier has a total phase variation of 90° over a particular frequency range (which would result in a 45° phase margin), the closed loop amplifier is likely to have a phase variation of around 270°. This means that the loop gain bandwidth product of the outer loop will have to be around a third of that of the inner loop, which will mean that the linearity improvement due to the outer loop will be of the order of a third of that achievable by the inner loop. However this can still be a useful improvement on what can be obtained without the use of nested loops.

Phase shift variation around the loop may be reduced, and stability and loop performance thereby improved, by providing zeros in the loop gain transfer function, as is traditionally done by velocity feedback. For example zeros could be used to compensate for the poles due to the output matching network. These may be deliberately inserted with separate resonant circuits, or may alternatively be inserted by use of power reflected from a frequency dependant load (e.g. filter input impedance or resonant antenna) which will normally be designed to be minimised at the mid-band frequency. If the directional coupler has finite directivity and if the distance to the load is correct, this reflected signal will add to the forward signal, thus increasing the feedback away from the mid-band frequency. The question of the deliberate insertion of zeros will be addressed below. However, rather than decreasing the stability by increasing the loop gain, such an arrangement can help to reduce the phase shift change. If this were done it would probably be best to use a non-directional coupler, such as a resistive or capacitive pick off. The only reason for using a directional coupler is to make operation more tolerant of load variations and, as such couplers are difficult to fabricate on a chip, they are unlikely to be used for such a realisation.

Figure 6:
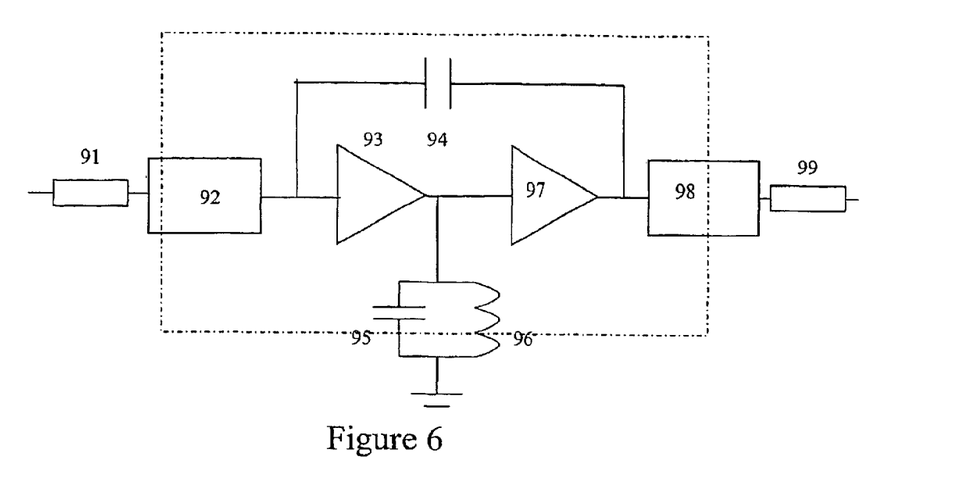
FIG. 6 is a block diagram of a fifth embodiment.

FIG. 6 shows a fourth embodiment in accordance with the invention which is particularly suited to integrated circuit implementation. It is essentially a bandpass equivalent of the conventional inverting feedback amplifier used with operational amplifiers. The dotted line encloses the circuit implemented monolithically. The components denoted by the reference numerals in FIG. 6 are as follows:

91. Input transmission line
92. Input matching network (probably including bond wire)
93. First stage or stages of amplifier
94. Feedback Capacitor
95. Capacitance of resonator
96. Inductance of resonator
97. Output stage or stages of amplifier
98. Output matching network
99. Output transmission line
100. Transistor Bond wire inductances can be used to form tuned circuits and matching networks, and this is what is implied by the dotted line going through 92, 98 and 96. Although the feedback component is a capacitor, its effect is analogous to an imaginary valued resistor in a baseband operational amplifier. If the amplifier phasing is correct, the effect of the capacitor on the input impedance by the Miller effect is to shunt the input of 93 by a low resistance and not the large capacitance one might expect.

Figure 7:
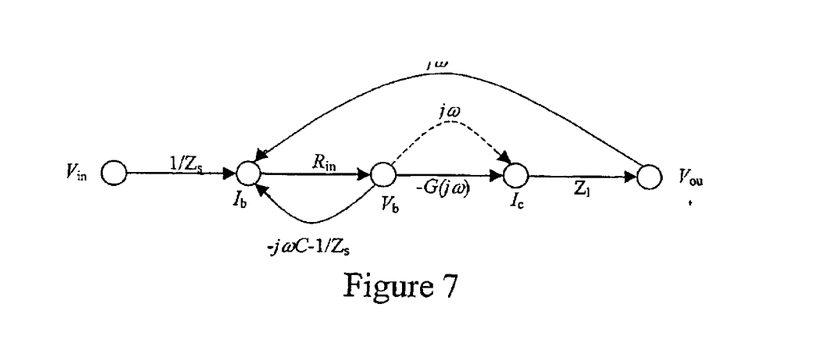
FIGS. 7 and 8 are circuit analysis diagrams relating to the embodiment of FIG. 6.

The analysis of the circuit is best presented by the signal flow graph of FIG. 7, in which:

$V_{in}$ is the Thevenin equivalent voltage due to the input signal at the output of 92.
$V_{out}$ is the output voltage applied to 98.
$I_b$ is the input current to the first stage of amplifier 93.
$V_b$ is the input voltage of amplifier 93.
$I_c$ is the output current from amplifier 97 with its actual loading $Z_1$.
$Z_s$ is the output impedance of the input matching network.
$R_{in}$ is the input resistance of amplifier 93 (any reactive component in parallel should be included in the matching network).
C is the feedback capacitor.
$G(j\omega)$ is the transresistance transfer function of 93, 95,96 and 97 when loaded with $Z_1$.
$Z_1$ is the total load on 97 comprising the input impedance of 98 in parallel with the output impedance of 97, in parallel with C.

Figure 8:
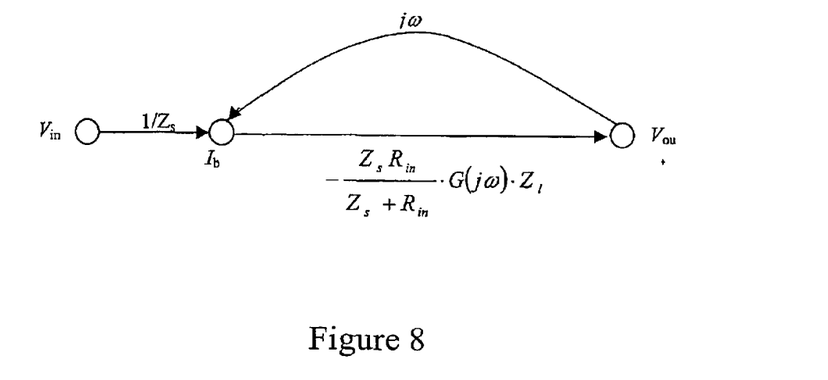

The dotted arc produces little effect on system performance, as does the $-j\omega C$ term on the arc from $V_b$ to $I_b$, and these will be omitted for clarity leading to the simplified diagram of FIG. 8.

Two of the three terms in the arc from $I_b$ to $V_{out}$ are impedance functions of passive networks. These have the characteristic that phase shifts are limited to ±90 degrees, and as a consequence the difference between the numbers of poles and zeros cannot exceed one. So, if they have appropriate amplitude responses, they could potentially be used as the resonator. In many cases $Z_1$ must have a minimum resistive impedance at the operating frequency which would make it unsuitable for this. However there are no such constraints on the other term, which is dominated by $Z_s$. This would mean that 95 and 96 could be eliminated and 93 and 97 amalgamated if 92 were to have an impedance maximum at the operating frequency and its Q were sufficiently high.

The advantages of this circuit are as follows. The circuit does not use external hybrids or directional couplers. It does not require the differential input stage required by other topologies. This removes the current consumption of another transistor. There are no resistive loss components to degrade noise performance or to absorb any of the output power other than that which is actually fed back. Another result is that most of the net input signal power to the summing junction not absorbed by the input of 93, is added to the output power (although some is dissipated in the output impedance 97) as opposed to all of it being dissipated in a resistor as would happen in almost all other feedback topologies.

Figure 9:
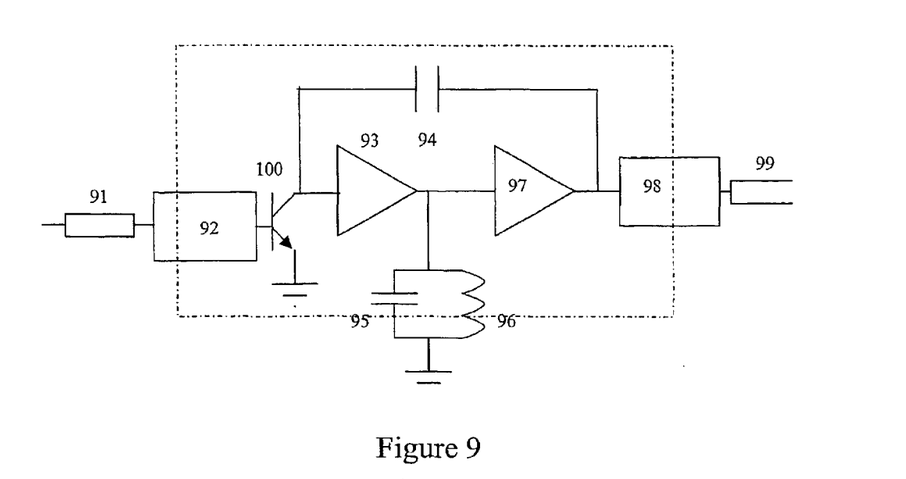
FIG. 9 is a block diagram illustrating a possible modification to the embodiment of FIG. 6.

Unfortunately the input cannot be matched to the impedance of the summing junction as this would reduce the loop gain to zero dB. Effectively, most of the fed back power is reflected to the source if feedback is to be used for linearisation. If an input mismatch is to be avoided without the use of a hybrid, either a resistor approximately equal to the signal source impedance must be inserted in series with it, or a transistor preamplifier used as in FIG. 9. The disadvantage of using the resistor method is that the noise figure will be degraded by approximately 3 dB. The disadvantage of the use of a transistor preamplifier is that any non-linearity it introduces will not be reduced by the feedback loop and the level of power required from the feedback circuit will be increased, which can cause a significant reduction in the output power. This can be significant when maximisation of the power efficiency is a major objective.

Figure 10:
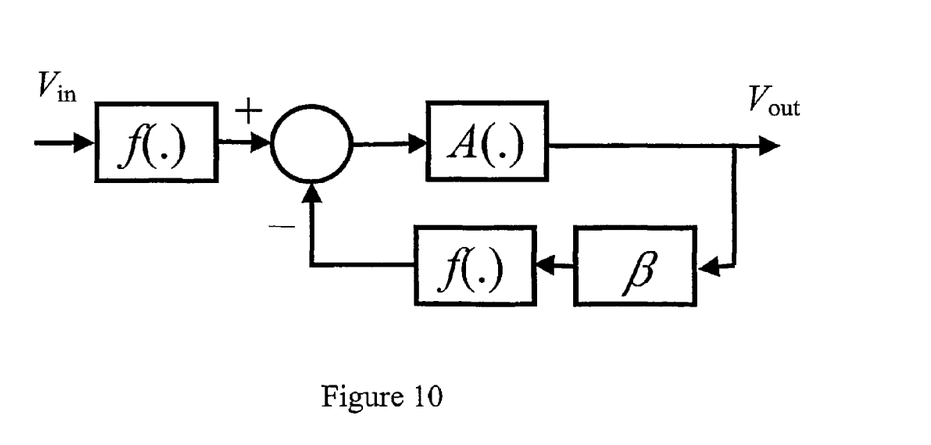
FIG. 10 is a circuit analysis diagram relating to a sixth embodiment.

A better solution is the concept of matching the non-linearity with a similar non-linear response using, ideally, identical amplifier stages in the input and feedback paths as shown in principle in FIG. 10. This ensures that, in the limit as loop gain is increased, the distortion effects will cancel out. This means that non linear stages, such as class B amplifiers, may be used so long as they have sufficient gain up to the maximum signal levels encountered, which will normally mean that they do not go into limiting or saturation.

Figure 11:
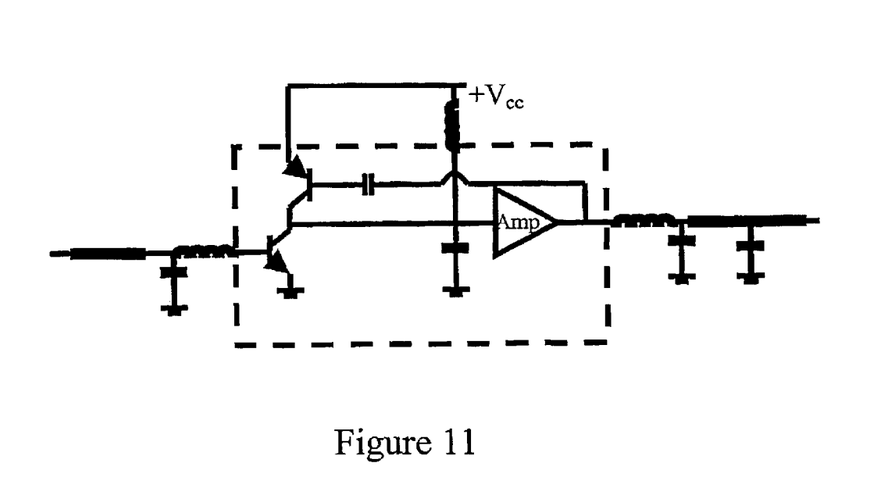
FIGS. 11 and 12 are block diagrams of possible implementations of the embodiment of FIG. 10.
Figure 12:
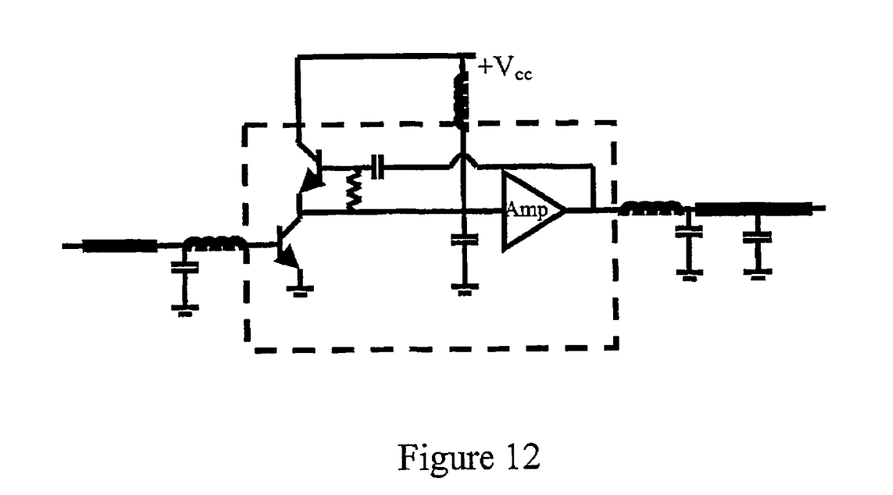

FIG. 11 shows a possible implementation of this idea. However it uses complementary transistors, and it is difficult if not impossible to achieve the appropriate matching between the complementary transistors due to the differing mobilities of holes and electrons. As well as this some otherwise suitable processes do not have the ability to fabricate complementary transistors at all. For this reason the circuit of FIG. 12 is to be preferred. Although it is not fully symmetrical, it approaches the performance of a symmetrical circuit as the loop gain is increased. The reason for this is that the summing junction tends to a virtual earth.

One of the inherent results of using feedback is that the small signal bandwidth of the transmit amplifier is much larger than it would be without the feedback. This is because at high loop gain the closed loop frequency response tends to the inverse of the frequency response of the feedback. This could degrade the performance of frequency division duplex systems because of the reduction in the filtering of the transmitter noise at the receive frequency, and also frequencies at which noise could be produced at the receiver by non-linear effects.

Figure 13:
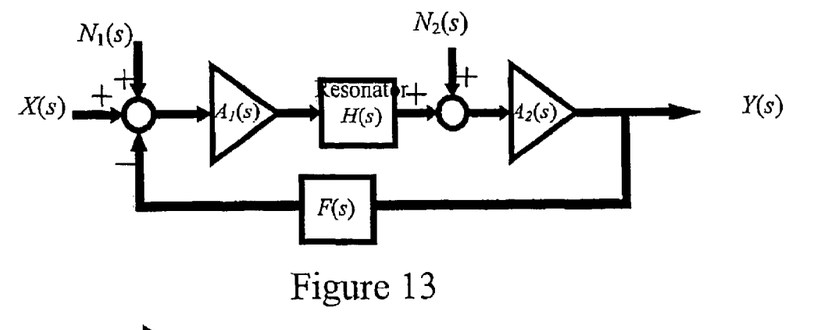
FIG. 13 is a circuit analysis diagram relating to a seventh embodiment, FIGS. 14, 15, 16 and 17 being circuit diagrams of possible implementations of the embodiment.

If the feedback were to have a reasonably high Q zero at the operating frequency, this would help the situation as the closed loop response would tend to become bandpass. In order to make the loop gain bandpass, another pole would be required in the forward path. If this were coincident with the zero, it would cancel it out and leave the loop gain and stability unchanged. However this is neither necessary or necessarily desirable. In fact the system would be the bandpass equivalent of a type 2 servomechanism with velocity feedback. This is illustrated in FIG. 13 in which $H_1$ and $H_2$ are single pole pair filter responses $H_2^{-1}$ is a single zero, like velocity feedback. Other zero positions could be used with the dynamics being that of a type 2 servomechanism.

Loop gain=$A_1H_2A_2$

Closed loop gain tends to $H_1$.

Figure 14:
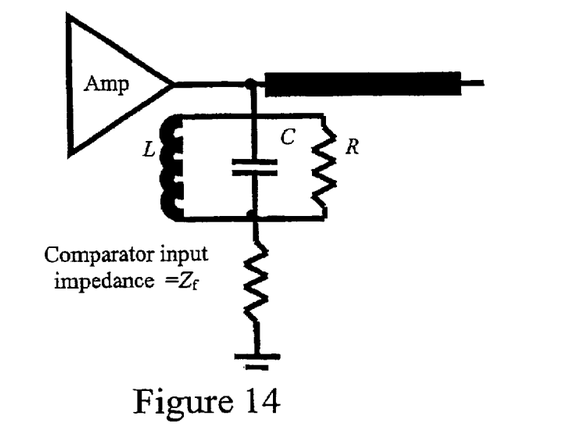

It may be desirable to implement a zero in the feedback path to improve dynamic performance and stability as well as for the above purpose. However it is not possible to make a filter to implement an isolated zero as this would imply that the gain would go to infinity as frequency increased, and in the above it is assumed that a pole will also be implemented r times as far from the imaginary axis. It may be readily shown that, for a circuit such as shown in FIG. 14, the efficiency with which the power is absorbed by the circuit from the amplifier output is 1/r. This is obviously very wasteful of power. It may be shown that other means of implementing a zero as a two-port filter will suffer the same disadvantage. As well as this the closed loop gain will be proportional to the Q of the zero, and this may cause unacceptable statistical variations.

Figure 15:
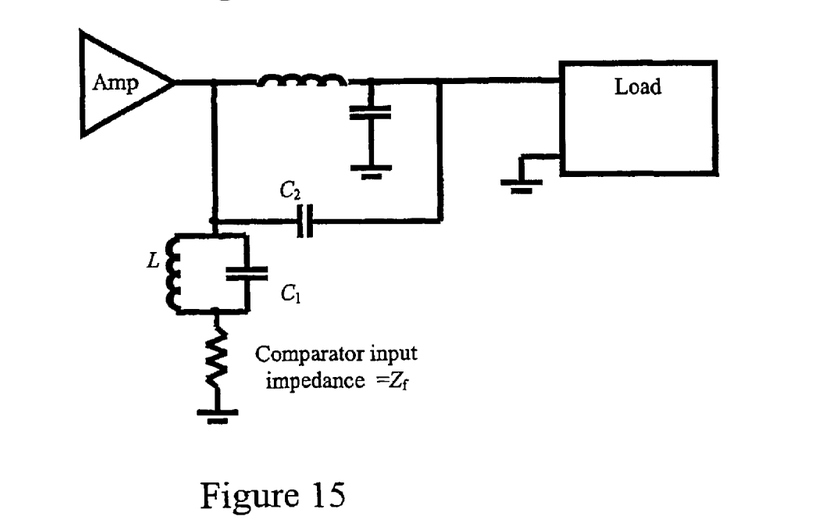
Figure 16:
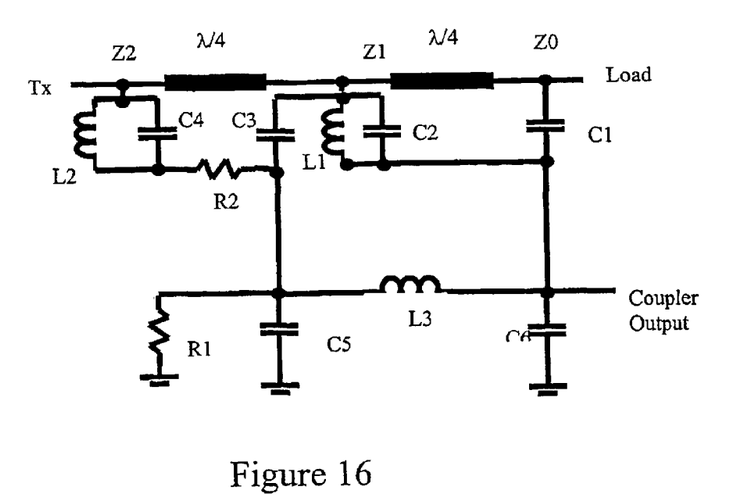
Figure 17:
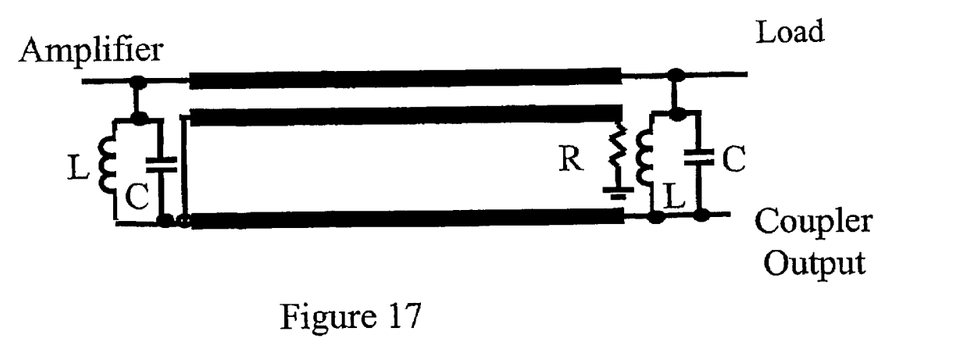

However, by combining signals from two points on the output signal path separated by 90 degrees, this theoretical limitation on two-port zero implementations may be overcome, as illustrated by the circuit shown in FIG. 15. It is assumed that the impedance step-up is sufficiently high for the phase difference between the pickoff points A and B to be approximately 90 degrees. Here the Q of the tuned circuit consisting of $C_1$ and L is taken as high, and the Q of the zero and r are set by $C_2$. Also at the operating frequency the level of feedback, and hence the closed loop gain, are determined by the magnitude of $C_2$, not by the Q of the resonant circuit.

Figure 18:
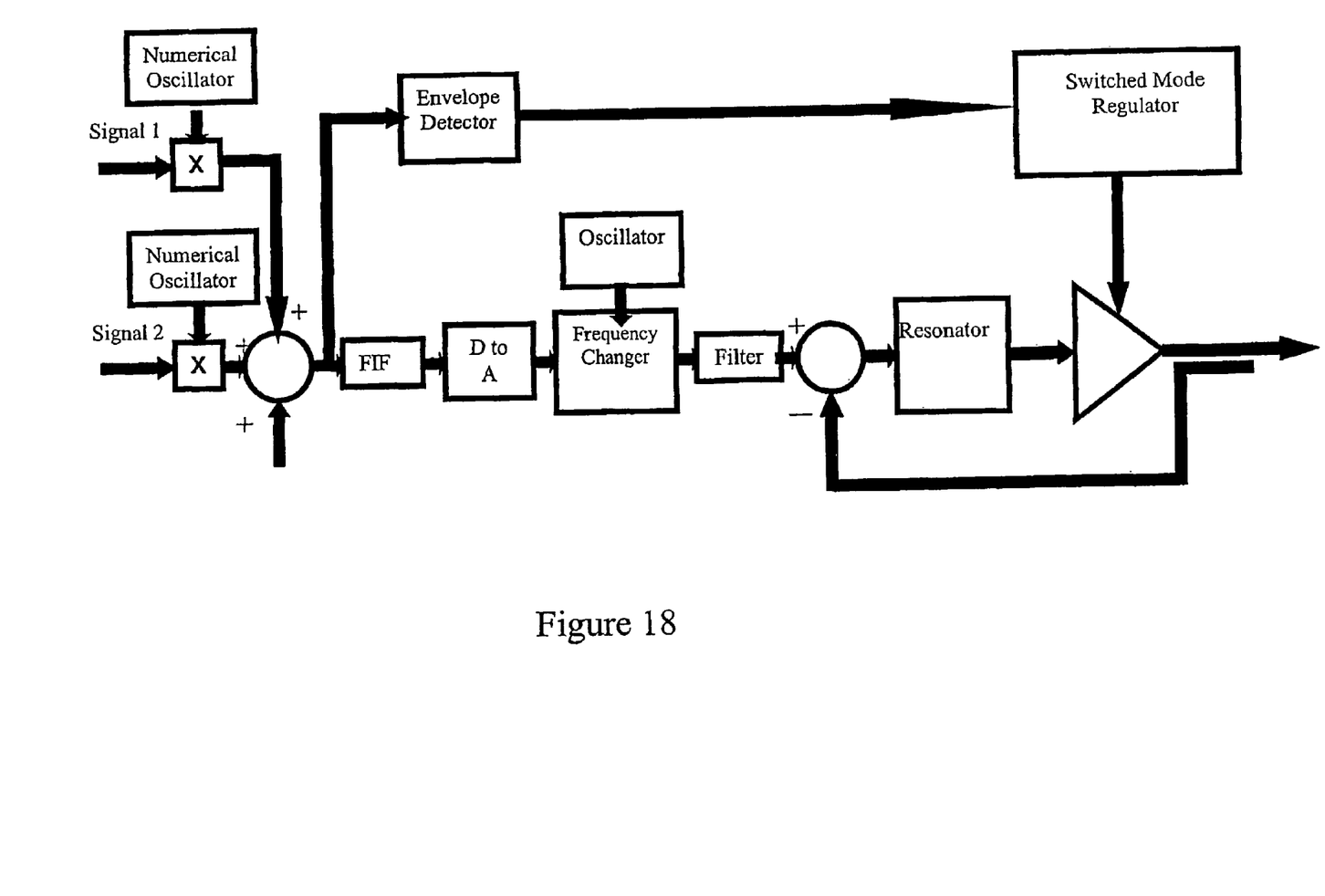
FIG. 18 is a circuit analysis diagram relating to an eighth embodiment.

The above techniques may be used to enhance the performance of other systems used to boost the efficiency of R.F amplifiers, for example a multi-carrier amplifier, such as may be required at base stations. The combination of a number n of sinusoidal signals produces a signal which has short bursts of rf power whose peak may be up to n times the average power. The duration of these bursts is related to the frequency separation of the constituent signals, and the magnitude of the instantaneous power approximates to a Gaussian distribution. The highest peaks thus occur relatively infrequently. If the D.C. voltage supplied to the amplifier is sufficient to ensure that the peaks of this waveform can be amplified without distortion, the power efficiency, even for class B amplifiers, being divided by n, becomes very low. One way to regain overall system efficiency is to use a controlled switched mode regulator to supply this voltage, and adjust it to supply just enough voltage to supply the anticipated instantaneous requirements. This may be readily predicted if the multi-carrier signal is generated digitally (probably at baseband or an intermediate frequency) and delayed with a FIFO buffer before being sent to the D to A converter and then frequency changed to the radio frequency. The difficulty to be overcome in doing this is that the change in DC voltage will modulate the signal, both in phase and amplitude, at a frequency range comparable with the carrier separation. The interference caused by this could be greater than that due to the waveform clipping which it was intended to overcome. However the use of the techniques described in this patent to the amplifier would reduce these effects such as to make the technique viable. FIG. 18 shows an example of such a method for illustration.

What is claimed is:

1. A radio frequency feedback amplifier circuit of high linearity at, and close to, a frequency of an input signal with which the circuit is to be used, the circuit comprising high gain amplifier means incorporating a bandpass filter in the form of a high Q resonance means (62) connected in a forward path of the amplifier means and having its resonant frequency at substantially the frequency of the input signal, feedback means in the form of a linear passive circuit, and tuning means (64, 65, 66, 67) for automatically tuning the resonant frequency of the resonance means (62) in dependence on the frequency of the input signal.

2. A circuit according to claim 1, wherein the tuning means (64, 65, 66, 67) comprises phase detection means (66) for determining the phase shift across the resonance means (62) and for adjusting a variable capacitance (64, 65) within the resonance means (62) to tune the resonant circuit.

3. A circuit according to claim 2, wherein the tuning means (64, 65, 66, 67) comprises an analogue or digital integrator (67) for supplying a tuning control signal to the variable capacitance (64, 65) in dependence on the output of the phase detection means (66).

4. A circuit according to claim 2, wherein the phase detection means comprises a Gilbert cell (66).

5. A circuit according to claim 1, wherein adjustment means (71, 72, 73, 74) is provided for automatically adjusting the phase of the loop gain provided by the feedback means at the resonant frequency of the resonance means (62).

6. A radio frequency feedback amplifier circuit of high linearity at, and close to, the frequency of the input signal with which the circuit is to be used, the circuit comprising high gain amplifier means incorporating a bandpass filter in the form of a high Q resonance means (62) connected in the forward path of the amplifier means and having its resonant frequency at substantially the input frequency, feedback means in the form of a linear passive circuit, and adjustment means (71, 72, 73, 74) for automatically adjusting the phase of the loop gain provided by the feedback means at the resonant frequency of the resonance means (62), wherein the adjustment means (71, 72, 73, 74) comprises phase detection means (72) for determining the phase shift provided by the feedback means and for adjusting a variable capacitance (74) to tune the feedback means.

7. A circuit according to claim 6, wherein the adjustment means (71, 72, 73, 74) comprises an integrator (67) for supplying a control signal to the variable capacitance (74) in dependence on the output of the phase detection means (72).

8. A circuit according to claim 3, wherein adjustment means is provided for automatically adjusting the phase of the loop gain provided by the feedback means at the resonant frequency of the resonance means, the adjustment means comprising a circuit for producing a phase control signal which is a function of the tuning control signal.

9. A radio frequency feedback amplifier circuit of high linearity at, and close to, the frequency of the input signal with which the circuit is to be used, the circuit comprising high gain amplifier means incorporating a bandpass filter in the form of a high Q resonance means (62) connected in the forward path of the amplifier means and having its resonant frequency at substantially the input frequency, and feedback means in the form of a linear passive circuit for deliberately applying positive feedback in order to increase the effective Q of the resonator (62) while preventing oscillation.

10. A radio frequency feedback amplifier circuit of high linearity at, and close to, the frequency of the input signal with which the circuit is to be used, the circuit comprising high gain amplifier means incorporating a bandpass filter in the form of a high Q resonance means (62) connected in the forward path of the amplifier means and having its resonant frequency at substantially the input frequency, and feedback means in the form of a linear passive circuit, wherein the amplifier means incorporates an amplifier stage (68) coupled to the resonance means (62) and provided with the feedback means, and a further amplifier stage (83) is coupled between the input of the amplifier means and a further resonance means (82) and provided with further feedback means.

11. A circuit according to claim 1, wherein the feedback means incorporates a non-directive or partially directive coupler.

12. A circuit according to claim 1, wherein the feedback means comprises capacitive feedback to a summing junction.

13. A circuit according to claim 1, wherein the loop phase gain is approximately zero at the frequency of the input signal.

14. A circuit according to claim 1, wherein the circuit incorporates an output load matching network which serves as the resonance means.

15. A circuit according to claim 1, wherein the circuit incorporates an input load matching network which serves as the resonance means.

16. A circuit according to claim 14, in which the output matching network impedance is used to provide the resonator functionality.

17. A radio frequency feedback amplifier circuit of high linearity at, and close to, the frequency of the input signal with which the circuit is to be used, the circuit comprising high gain amplifier means incorporating a bandpass filter in the form of a high Q resonance means (62) connected in the forward path of the amplifier means and having its resonant frequency at substantially the input frequency, and feedback means in the form of a linear passive circuit, using capacitor feedback to a summing junction with a resonator or dominant conjugate pole pair in the forward path, in which the loop gain phase shift is designed to be approximately 180 degrees at the operating frequency.

18. A radio frequency feedback amplifier circuit of high linearity at, and close to, the frequency of the input signal with which the circuit is to be used, the circuit comprising high gain amplifier means incorporating a bandpass filter in the form of a high Q resonance means (62) connected in the forward path of the amplifier means and having its resonant frequency at substantially the input frequency, and feedback means in the form of a linear passive circuit, wherein means for matching non-linearity in feedback and input paths are provided to implement a monolithic comparator while avoiding conditional stability and input mismatching, without the use of an external hybrid.

19. A circuit according to claim 18, wherein a virtual earth is used in the feedback means to substitute for the actual ground used in the input amplifier.

20. A circuit according to claim 1, wherein a means for implementing a zero is used in the feedback means to reduce out-of-band noise in rf power amplifier means using feedback.

21. A radio frequency feedback amplifier circuit of high linearity at, and close to, the frequency of the input signal with which the circuit is to be used, the circuit comprising high gain amplifier means incorporating a bandpass filter in the form of a high Q resonance means (62) connected in the forward path of the amplifier means and having its resonant frequency at substantially the input frequency, and feedback means in the form of a linear passive circuit, wherein means are provided to implement a pole zero pair in a circuit sampling the output of the amplifier means in which the response is achieved by combining signals from points at different phases in the main signal path.

22. A circuit according to claim 21, which is adapted to reduce the loss in power inherent in use of other circuits for implementing pole zero pairs.

23. A circuit according to claim 22, which is adapted for setting more precisely the position of the zero to determine the level of feedback, and hence the closed loop gain, at the operating frequency.

24. A circuit consisting of two or more circuits according to claim 21, whose outputs are combined to effect directional response.

25. A circuit according to claim 21, wherein the outputs of a directional coupling circuit possessing a null, zero or minimum at the operating frequency is combined with that of a conventional directional coupler to produce the effect of a pole zero pair.

26. A radio frequency feedback amplifier circuit of high linearity at, and close to, a frequency of the input signal with which the circuit is to be used, the circuit comprising high gain amplifier means incorporating a bandpass filter in the form of a high Q resonance means (62) connected in a forward path of the amplifier means and having its resonant frequency at substantially the frequency of the input signal, feedback means in the form of a linear passive circuit and controlled switched mode regulator means controlled in dependence on an anticipated instantaneous voltage requirement of the amplifier means for supplying DC voltage to the amplifier means.

27. A radio frequency feedback amplifier circuit of high linearity at, and close to, the frequency of the input signal with which the circuit is to be used, the circuit comprising high gain amplifier means incorporating a bandpass filter in the form of a high Q resonance means C62) connected in the forward path of the amplifier means and having its resonant frequency at substantially the input frequency, feedback means in the form of a linear passive circuit and directional coupling means having a termination impedance matched to the output impedance of the amplifying means rather than being equal to the load impedance.

28. A transmitting and receiving station for a telecommunication network, the station having a transmitter incorporating a circuit according to claim 1.

* * * * *